(12) United States Patent
Noh

(10) Patent No.: US 8,331,161 B2
(45) Date of Patent: Dec. 11, 2012

(54) SEMICONDUCTOR MEMORY DEVICE HAVING SWAP FUNCTION FOR DATA OUTPUT PADS

(75) Inventor: Kwang-Sook Noh, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 12/662,018

(22) Filed: Mar. 29, 2010

(65) Prior Publication Data
US 2010/0246276 A1    Sep. 30, 2010

(30) Foreign Application Priority Data

Mar. 30, 2009   (KR) .................. 10-2009-0026833

(51) Int. Cl.
*G11C 7/10* (2006.01)
(52) U.S. Cl. .......... 365/189.02; 365/189.05; 365/189.06
(58) Field of Classification Search ............. 365/189.02, 365/189.03, 189.05, 189.06, 230.06; 326/39, 326/40, 41
See application file for complete search history.

(56) References Cited

U.S. PATENT DOCUMENTS

| | | | | |
|---|---|---|---|---|
| 5,469,003 A | * | 11/1995 | Kean | 326/39 |
| 5,500,609 A | * | 3/1996 | Kean | 326/41 |
| 5,835,436 A | | 11/1998 | Ooishi | |
| 6,650,142 B1 | * | 11/2003 | Agrawal et al. | 326/41 |
| 6,838,904 B1 | * | 1/2005 | Agrawal et al. | 326/41 |
| 2007/0165035 A1 | * | 7/2007 | Duluk et al. | 345/506 |
| 2008/0212351 A1 | | 9/2008 | Park | |

FOREIGN PATENT DOCUMENTS

| | | |
|---|---|---|
| JP | 2006-313645 A | 11/2006 |
| KR | 10-2008-0070093 A | 7/2008 |
| KR | 10-2008-0078340 A | 8/2008 |

\* cited by examiner

*Primary Examiner* — Gene Auduong
(74) *Attorney, Agent, or Firm* — Lee & Morse, P.C.

(57) ABSTRACT

A semiconductor memory device having a status register read function includes a plurality of data output pads electrically connected to corresponding package pin, and a swap controller connected between the plurality of data output pads and a plurality of output lines that output memory-related unique information in a specific operation mode. The swap controller controls a swap according to preset swap program information when a swap is needed to match the data output pads to the package pins.

12 Claims, 6 Drawing Sheets

FIG. 4

SEMICONDUCTOR MEMORY DEVICE HAVING SWAP FUNCTION FOR DATA OUTPUT PADS

BACKGROUND

1. Field

Embodiments relate to semiconductor memory devices and, more particularly, to a semiconductor memory device having a swap function to allow proper reading of a status register.

2. Description

In general, semiconductor memory devices, e.g., a dynamic random access memory (DRAM), have a high integration density and operate at high speeds. DRAMs include memory cells as storage units, each memory cell typically having one access transistor and one storage capacitor.

A micro processing unit in a data processing system may access data through a DRAM. In this case, internal information of the DRAM may need to be accessed. To this end, a status register read mode may be provided to the DRAM. When the DRAM enters the status register read mode, internal information of the DRAM may be output through pre-assigned data output pads.

DRAM chips may be packaged in various ways according to intended uses thereof. An arrangement of external pins of a package may be different from an arrangement of data output pads of a DRAM chip in the package. Therefore, swapping may be performed for data output pads of the package. Swapping may make normal operation in the status register read mode difficult to ensure. Accordingly, when the DRAM chip is mounted in a package having an arrangement of pins different from an arrangement of data output pads through which the memory-related unique information is output in a predetermined operation mode of the DRAM chip, measures are needed to allow a controller external to the DRAM chip to reliably read memory-related unique information of the DRAM chip.

SUMMARY

Embodiments are therefore directed to semiconductor memory device having a swap function of a status register and associated methods, which substantially overcome one or more of the problems due to the limitations and disadvantages of the related art.

Accordingly, some embodiments of the invention provide a semiconductor memory device capable of performing a swap operation on the basis of swap program information even when a DRAM chip is mounted in a package having an arrangement of pins different from an arrangement of data output pads, through which the memory-related unique information is output in a predetermined operation mode, of the DRAM chip.

Some embodiments of the invention provide a semiconductor memory device allowing a controller outside a DRAM chip to reliably read memory-related unique information even when an arrangement of data output pads of the DRAM chip is different from an arrangement of pins of a package having the DRAM chip.

Some embodiments of the invention provide a semiconductor memory device capable of reliably ensuring a status register read function for various packages.

Some embodiments of the invention provide a semiconductor memory device having a function capable of compensating a swap of data output pads.

Some embodiments of the invention provide a semiconductor memory device capable of supporting functions such as a status register read mode without any errors and regardless of arrangements of external pins of packages.

At least one of the above and other features and advantage's may be realized by providing a semiconductor memory device having a status register read function includes a plurality of data output pads to be electrically connected to corresponding package pins in a packaging process, and a swap controller connected between the plurality of data output pads and a plurality of output lines that output memory-related unique information in a specific operation mode, the swap controller configured to control a swap according to preset swap program information when a swap among the data output pads is required for matching with the package pins.

The swap controller may include a multiplexing unit having a plurality of multiplexers for every byte, each of the multiplexers connected to every predetermined number of the plurality of output lines, and swap correction units generating multiplexing selection signals according to the preset swap program information and apply the multiplexing selection signals to the plurality of multiplexers as to control the swap among the data output pads.

The preset swap program information may allow a bit swap within one byte or a byte swap.

The multiplexing selection signals may be generated by a fuse program and the multiplexers may be 4-to-1 multiplexers or 2-to-1 multiplexers.

Some of the data output pads may be subjected to a swap according to the operation of the multiplexers and the others of the data output pads are coded into specific logic data.

At least one of the above and other features and advantages may be realized by providing a semiconductor memory device that includes a plurality of data output pads to be electrically connected to corresponding package pins in a packaging process, and a swap controller connected between the plurality of data output pads and a plurality of output lines for outputting memory-related unique information in a status register read operation mode, and controlling a swap according to preset fuse program information when a swap among the data output pads based on the package pins is required for matching with the package pins. The swap controller may include a multiplexing unit having a plurality of multiplexers for every byte, each of the multiplexers connected to every predetermined number of the plurality of output lines, and swap correction units generating multiplexing selection signals according to the preset fuse program information and apply the multiplexing selection signals to the plurality of multiplexers as to control the swap among the data output pads.

When the number of data output pads is 32, the multiplexers may be 4-to-1 multiplexers. The preset fuse program information may allow a bit swap within one byte or a byte swap.

At least one of the above and other features and advantages may be realized by providing a method of swapping data output pads of a semiconductor memory device having a status register read function for matching with package pins. This method includes comparing an arrangement of the data output pads with an arrangement of package pins to be electrically connected to the data output pads in a packaging process, and swapping the data output pads on the basis of the package pins for matching with the package pins in response to the comparison result.

As described above, according to some embodiments of the invention, a status register read mode operation may properly operate even when a swap operation to match data output pads to corresponding pins of a package is needed.

BRIEF DESCRIPTION OF THE DRAWINGS

The above and other features and advantages will become more apparent to those of ordinary skill in the art by describing in detail exemplary embodiments with reference to the attached drawings, in which:

FIG. 4 illustrates a diagram of examples of a swap of data output pads based on types of packages capable of adapting the DRAM shown in FIG. 2;

DETAILED DESCRIPTION

Korean Patent Application No. 10-2009-0026833, filed on Mar. 30, 2009, in the Korean Intellectual Property Office, and entitled: "Semiconductor Memory Device Having Swap Function for Data Output Pads," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
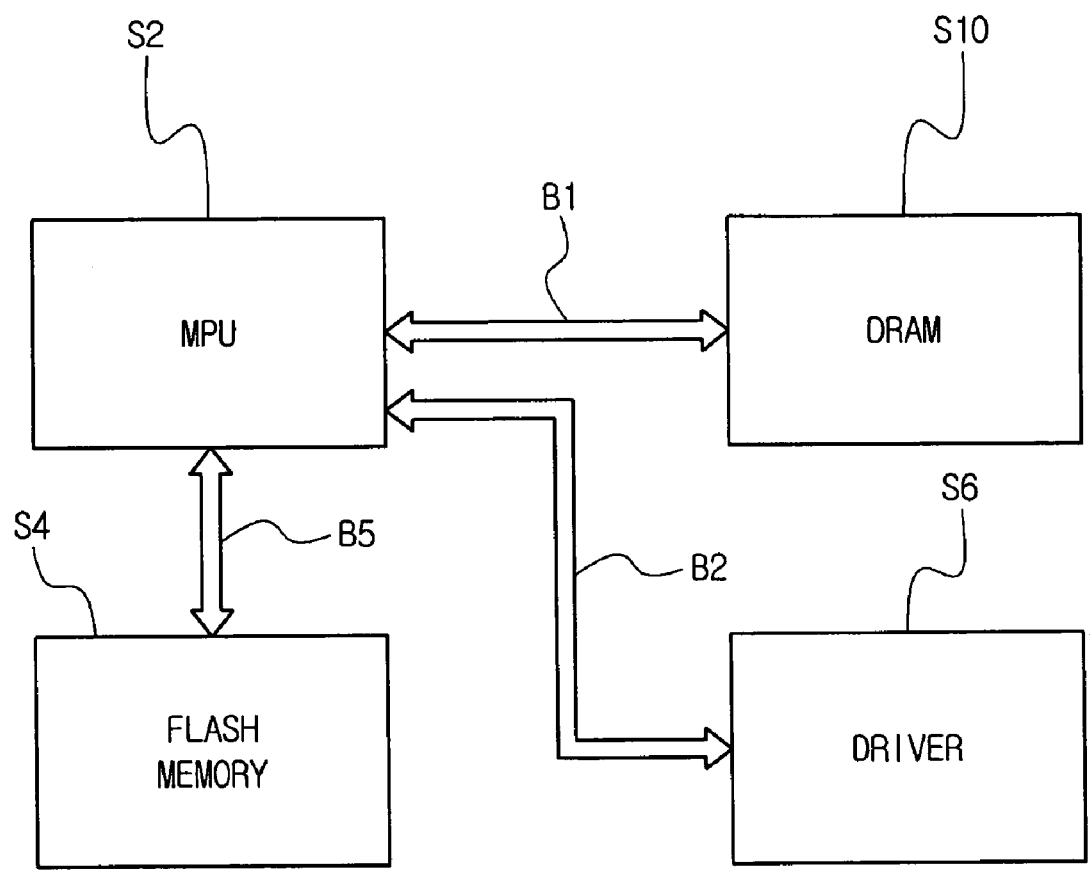
FIG. 1 illustrates a block diagram of a data processing system capable of adapting an embodiment of the invention.

Embodiments of the present invention now will be described more fully hereinafter with reference to FIGS. 1 to 6. FIG. 1 illustrates a block diagram of a processing system in which a DRAM in accordance with embodiments may be employed, as will be described after embodiments of the DRAM have been described. First, the related art status register read (hereinafter, referred to as 'SRR') operation will be described briefly with reference to FIGS. 2 to 4 in order to provide a thorough understanding of embodiments of the present invention.

Figure 2:
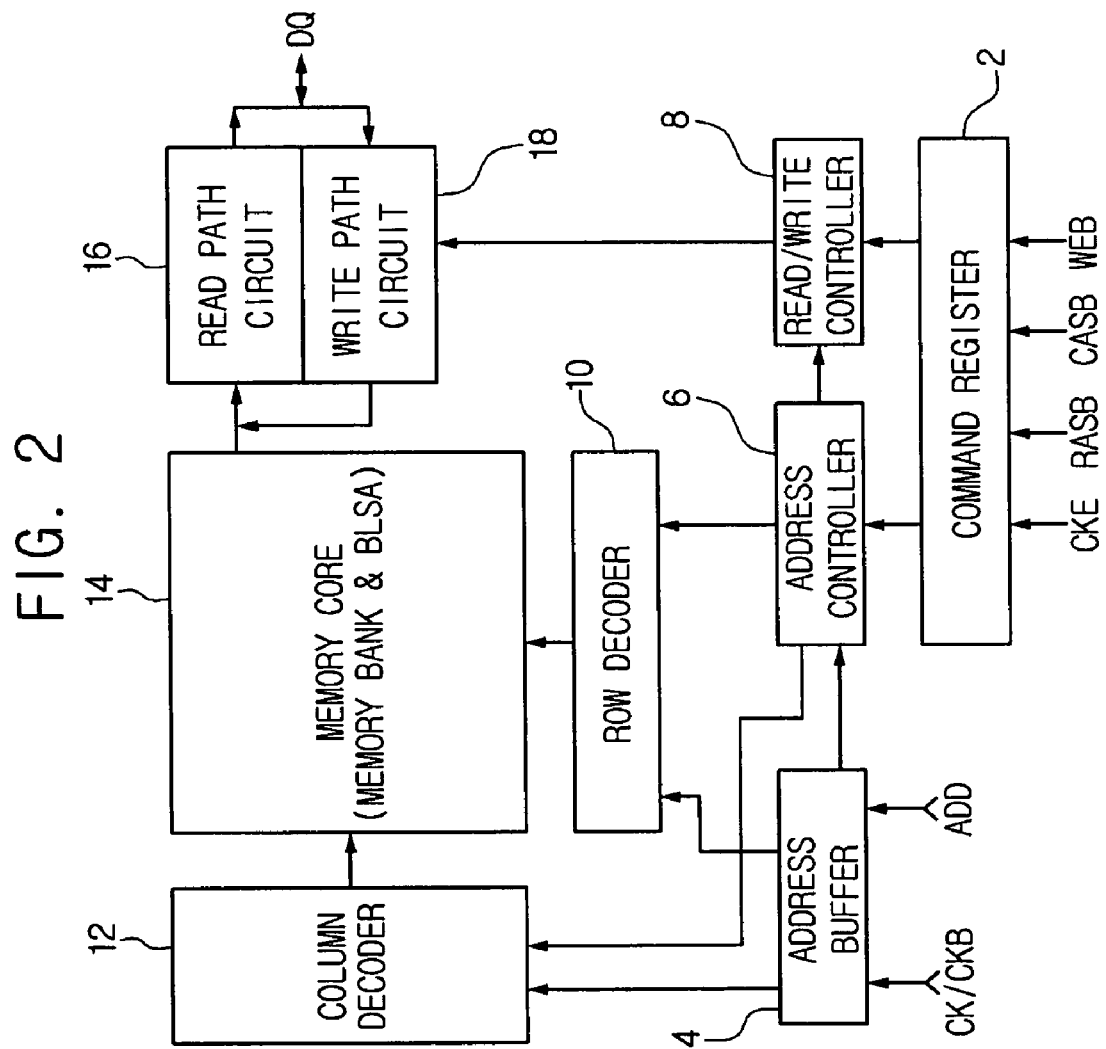
FIG. 2 illustrates a block diagram of a configuration of a DRAM shown in FIG. 1.
Figure 3:
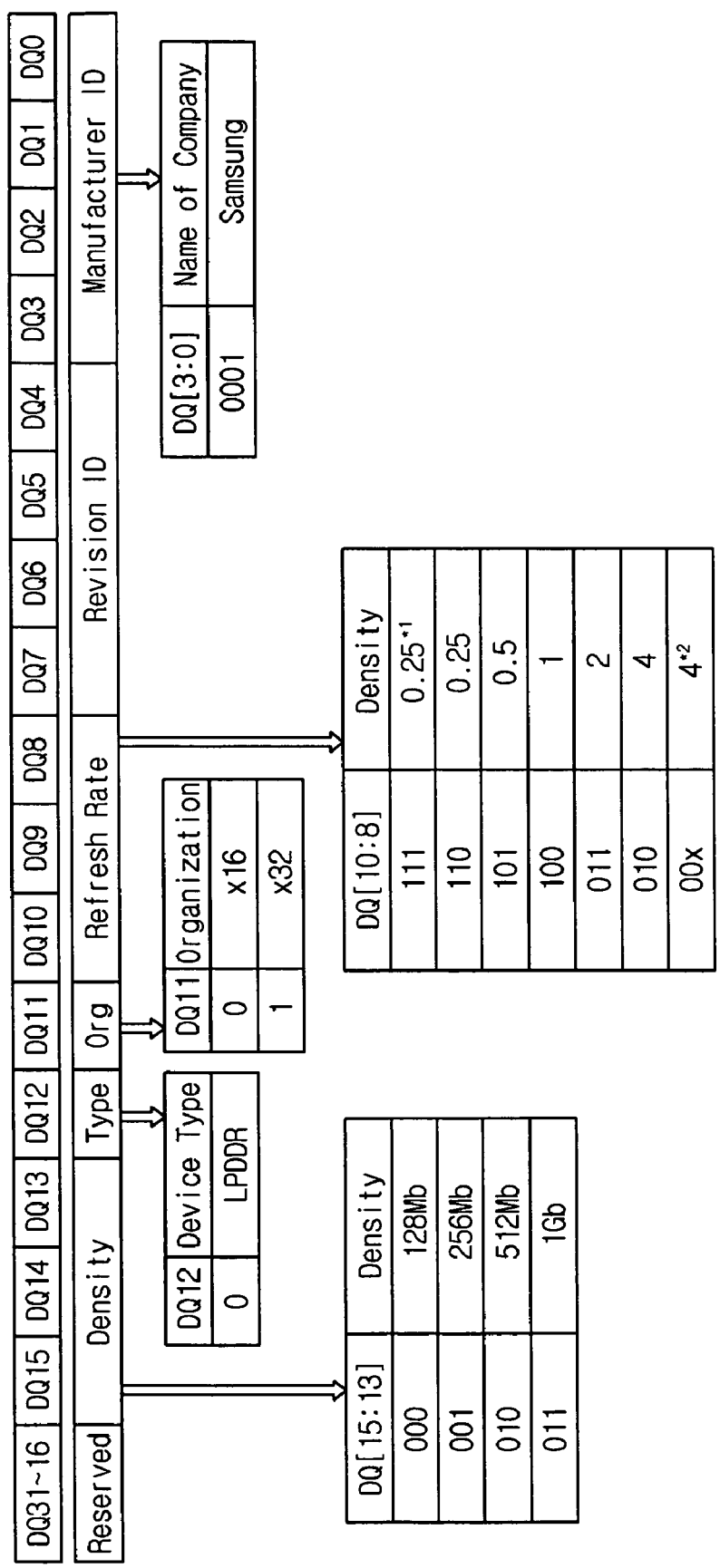
FIG. 3 illustrates a diagram of an example of unique information assigned to data output pads during a SRR operation of a DRAM shown in FIG. 2.
Figure 4:
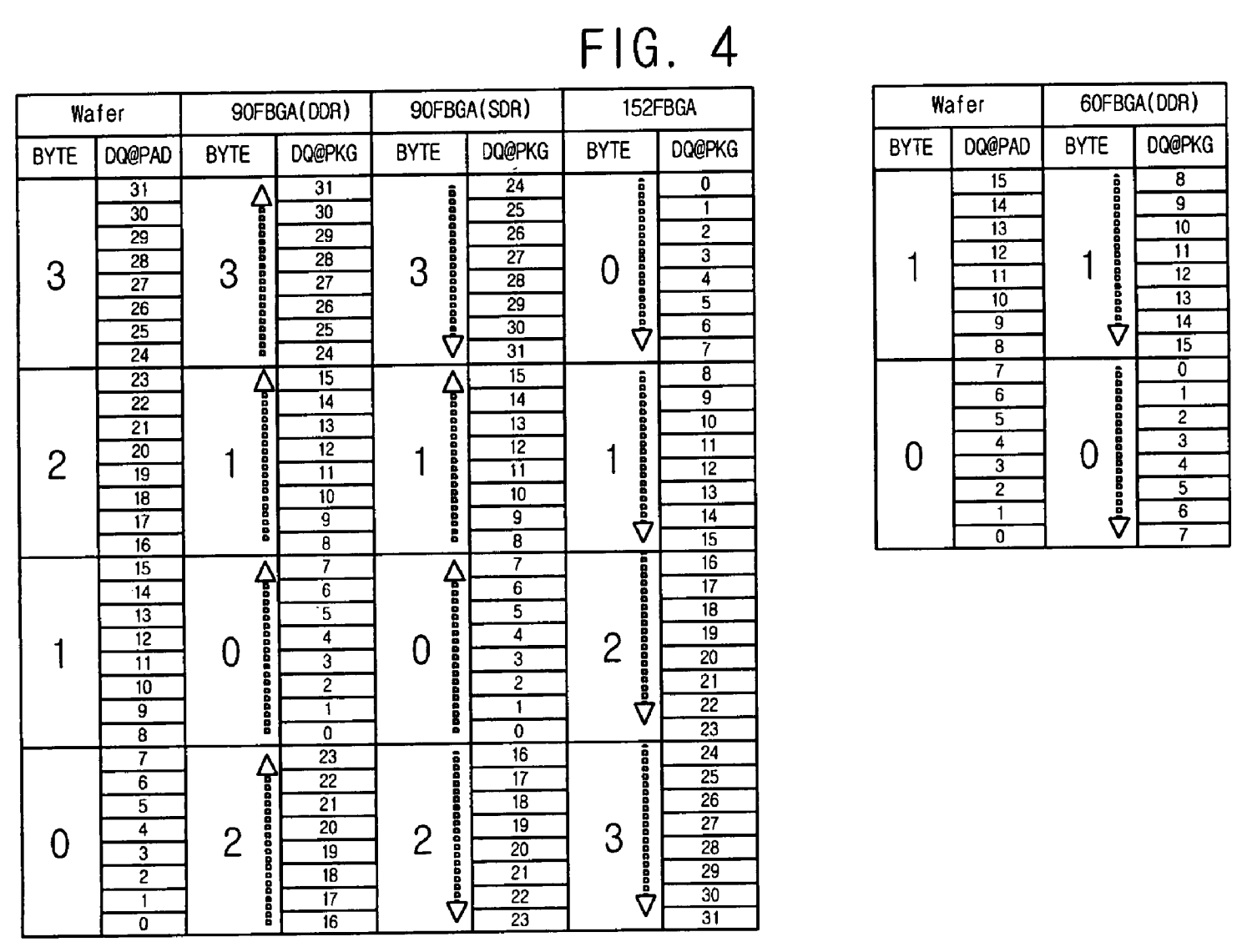

FIG. 2 illustrates a block diagram of a DRAM. FIG. 3 illustrates an example of unique information assigned to data output pads during a SRR operation of a DRAM shown in FIG. 2. FIG. 4 illustrates examples of a swap of data output pads based on types of packages that may be used with the DRAM shown in FIG. 2.

FIG. 2 illustrates connections between typical functional blocks to which embodiments of the invention may be employed. Referring to FIG. 2, a DRAM may include a command register 2, an address buffer 4, an address controller 6, a read/write controller 8, a row decoder 10, a column decoder 12, a memory core 14, a read path circuit 16, a write path circuit 18, and data output pads DQ.

The command register 2 may receive a clock enable signal CKE, a row address strobe signal RASB, a column address strobe signal CASB, and a write enable signal WEB, and may apply a command signal to the address controller 6 and the read/write controller 8.

The address buffer 4 may store address information ADD, including a row address and a column address, in response to clocks CK and CKB, and may supply the row address and the column address to the row decoder 10 and the column decoder 12, respectively.

The memory core 14 may include a plurality of bit line sense amplifiers (BLSA) and a memory cell array having a plurality of memory banks. Each of the bit line sense amplifiers may be connected to a bit line pair. The memory banks may include a plurality of memory cells MC disposed at intersections of word lines and bit lines. Each memory cell may include one access transistor AT and one storage capacitor SC.

The address controller 6 may generate an address to access data and control a refresh operation to retain data. The row decoder 10 may be connected to the address controller 6 and the memory core 14, and may decode the row address to activate a selected word line. The column decoder 12 may receive the column address and output a column selection signal to select bit lines corresponding to selected memory cells in the memory core 14.

The read path circuit 16 and the write path circuit 18 may include input/output lines, a plurality of amplifier circuits, a plurality of precharging units, a plurality of buffers, etc. The read path circuit 16 and the write path circuit 18 may further include local input/output line drivers and global input/output line drivers. The precharging units may include local input/output line precharging units. The amplifier circuits may include local sense amplifiers and global sense amplifiers. The read path circuit 16 and the write path circuit 18 may be connected in common to the data output pads DQ.

In an SRR operation mode, coded internal information may be output from the DRAM through the data output pads DQ. The DRAM may perform a standardized SRR operation to output internal information thereof to an external controller or processor. Therefore, specific information items may be output through data output pads DQ to which the specific information items are assigned.

Referring to FIG. 3, fixed information items having little to do with the operation of DRAM may be assigned to data output pads DQ0 to DQ7 and DQ11 to DQ15. Variable information items having much to do with the operation of DRAM may be assigned to data output pads DQ8 to DQ10.

For example, a manufacturer ID may be assigned to the data output pads DQ0 to DQ3, a mask revision ID may be assigned to the data output pads DQ4 to DQ7, and a refresh rate indicating the internal temperature of a DRAM chip may be assigned to the data output pads DQ8 to DQ10. Further, an organization ID may be assigned to the data output pad DQ11, a device type ID may assigned to the data output pad DQ12, and a density ID may be assigned to the data output pads DQ13 to DQ15. Furthermore, a reserved ID may be assigned to data output pads DQ16 to DQ31. Thus, as shown in FIG. 3, all data output pads DQ except for the data output pads DQ8 to DQ10 may be assigned fixed information items.

DRAM chips may be packaged in various ways according to uses thereof. DRAM chips may be applied to a SDR (single data rate) package, a DDR (double data rate) package, a 152-FBGA (fine-pitch ball grid array) package, etc. Often, an arrangement of external pins of a package is different from an arrangement of data output pads of a DRAM chip in the package.

FIG. 4 illustrates various arrangements of external pins of packages. On the left side of FIG. 4, three types of ×32 packages are illustrated. On the right side of FIG. 4, one type of ×16 package is illustrated. As the bit's significance increases within each byte, pin numbers of a package may increase or decrease. In FIG. 4, an increase in the pin numbers with an increase in the bit's significance is shown by an upward arrow and a decrease in the pin numbers with an increase in the bit significance is shown by a downward arrow.

Referring to FIG. 4, in case of a ×32 DRAM chip, i.e., having 32 data output pads DQ, manufactured on a wafer, data output pads DQ0 to DQ7 may correspond to a $0^{th}$ byte, data output pads DQ8 to DQ15 may correspond to a $1^{st}$ byte, data output pads DQ16 to DQ23 may correspond to a $2^{nd}$ byte, and data output pads DQ24 to DQ31 may correspond to a $3^{rd}$ byte. As shown in FIG. 4, within each of the $0^{th}$ to $3^{rd}$ bytes, data output pad numbers increase as the bit's significance increases.

For a ×32 DDR type package, as illustrated in FIG. 4, within each of the $0^{th}$ to $3^{rd}$ bytes, the pin numbers increase as the bit's significance increases. External pins of the DDR type package corresponding to the $3^{rd}$ byte are matched with the data output pads DQ of the DRAM chip corresponding to the $3^{rd}$ byte. However, external pins corresponding to the $0^{th}$ to $2^{nd}$ bytes do not match data output pads DQ corresponding to the $0^{th}$ to $2^{nd}$ bytes. In this case, a swap operation in byte units is needed. That is, a swap among the $0^{th}$ to $2^{nd}$ bytes to match the data output pads DQ of the DRAM chip with the external pins of the DDR type package is needed. As described above, when data output pads DQ of a DRAM chip are not matched with external pins of a DDR type package, a swap in byte units is required.

For a ×32 SDR type package, as illustrated in FIG. 4, within the $3^{rd}$ byte, the pin numbers decrease as the bit's significance increases. Moreover, an arrangement of the $0^{th}$ to $2^{nd}$ bytes in the SDR type package is not matched with the arrangement of the $0^{th}$ to $2^{nd}$ bytes in the DRAM chip. In this case, a swap operation not only in byte units is needed, but also a swap operation in bit units is needed for the $3^{rd}$ byte.

For a ×32 152-FBGA type package, as illustrated in FIG. 4, within each of the $0^{th}$ to $3^{rd}$ bytes, the pin numbers decrease as the bit's significance increases. Moreover, an arrangement of the $0^{th}$ to $3^{rd}$ bytes in the SDR type package is not matched with the arrangement of the $0^{th}$ to $3^{rd}$ bytes in the DRAM chip. In this case, a swap operation not only in byte units but also in bit units for all bytes is needed.

Referring to the right side of FIG. 4, in case of a ×16 DRAM chip, data output pads DQ0 to DQ7 may correspond to a $0^{th}$ byte, and data output pads DQ8 to DQ15 may correspond to a $1^{st}$ byte. As illustrated in FIG. 4, within each of the $0^{th}$ and $1^{st}$ bytes, data output pad numbers increase as the bit's significance increases.

For a ×16 DDR type package, it can be seen from FIG. 4 that, within each of the $0^{th}$ and $1^{st}$ bytes, external pins of the ×16 DDR type package are not matched with the data output pads DQ of the ×16 DRAM chip. That is, as the bit's significance increases, the external pin numbers decrease, while the data output pad numbers increase. In this case, a swap in bit units among the data output pads DQ in each byte is required to complete the DDR product.

As described above with reference to FIG. 4, when an arrangement of external pins of a package does not match an arrangement of data output pads DQ of a DRAM chip, an appropriate swap among the data output pads DQ is required. If a swap is not appropriately performed, a SRR operation during which DRAM-related internal information items are output through pre-assigned data output pads DQ may be disabled.

Therefore, a measure is required to allow an external controller to reliably read memory-related unique information when the DRAM chip having a plurality of data output pads that output memory-related unique information in a specific operation mode is applied to any one of various packages having different external pin arrangements.

For example, assuming that 16-bit coded DRAM information is output through predetermined data output pads DQ, when a swap among data output pads DQ in a package is required, a problem may occur in an SRR operation. For this reason, at least data output pads DQ8, DQ9, and DQ10 need to be corrected by a data output pad swap.

Figure 5:
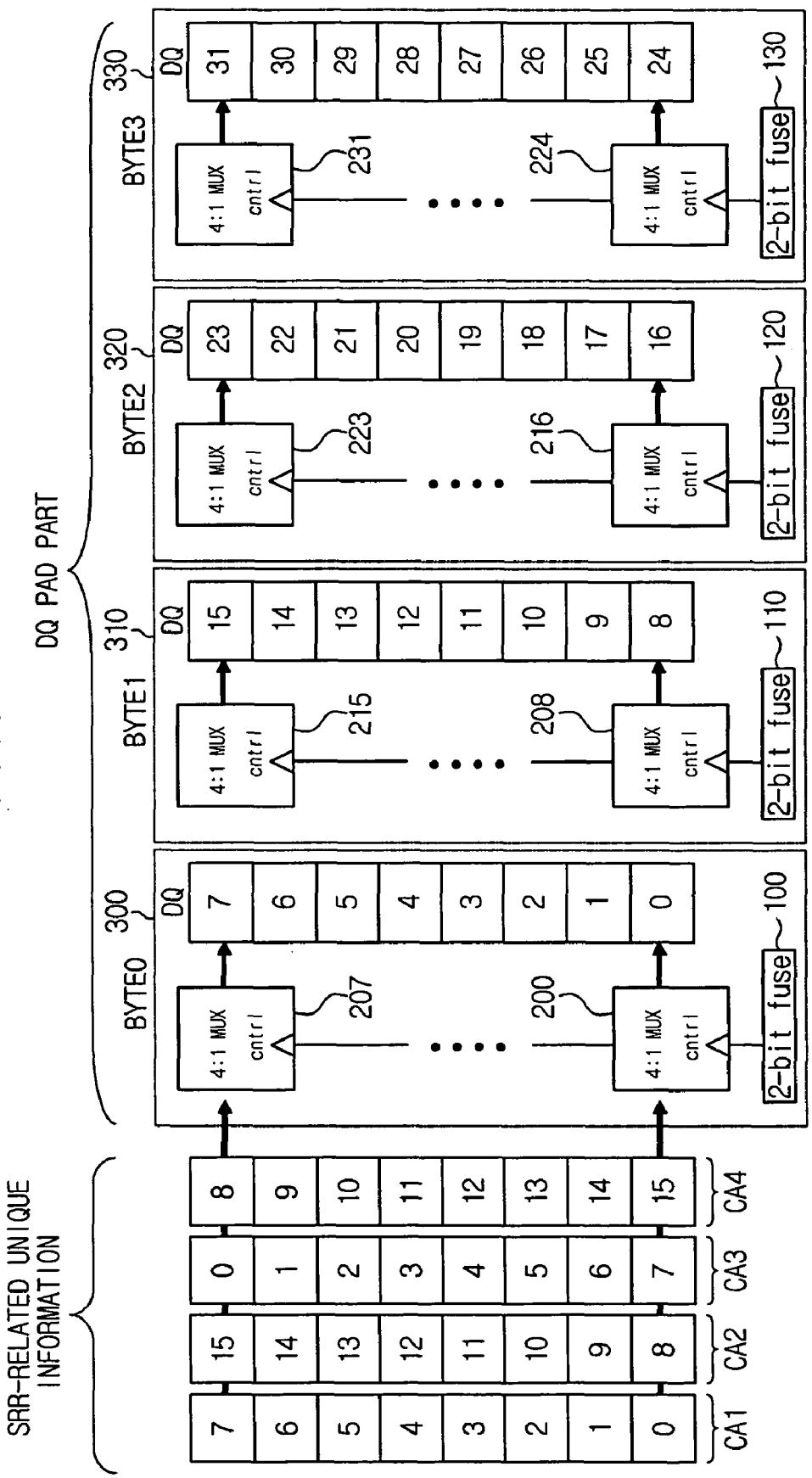
FIG. 5 illustrates a diagram of some of functional blocks of a semiconductor memory device having a function of performing a swap among data output pads according to an embodiment of the invention.

In order to solve the above-mentioned problem, an embodiment of the invention provides a semiconductor memory device having functional blocks shown in FIG. 5. FIG. 5 illustrates functional blocks of a semiconductor memory device performing a swap operation among data output pads according to an embodiment of the invention, as will now be described in detail.

Referring to FIG. 5, a $0^{th}$ byte block 300 may include a plurality of data output pads DQ0 to DQ7, a plurality of multiplexers 200 to 207 connected to corresponding data output pads DQ0 to DQ7, and a first swap correction unit 100 connected in common to selection terminals of the multiplexers 200 to 207. A 1st byte block 310 may include a plurality of data output pads DQ8 to DQ15, a plurality of multiplexers 208 to 215 connected to corresponding data output pads DQ8 to DQ15, and a second swap correction unit 110 connected in common to selection terminals of the multiplexers 208 to 215. A $2^{nd}$ byte block 320 may include a plurality of data output pads DQ16 to DQ23, a plurality of multiplexers 216 to 223 connected to corresponding data output pads DQ16 to DQ23, and a third swap correction unit 120 connected in common to selection terminals of the multiplexers 216 to 223. A $3^{rd}$ byte block 330 may include a plurality of data output pads DQ24 to DQ31, a plurality of multiplexers 224 to 231 connected to corresponding data output pads DQ24 to DQ31, and a fourth swap correction unit 130 connected in common to selection terminals of the multiplexers 224 to 231.

Multiplexers connected to corresponding output lines for outputting the memory-related unique information in an SRR operation mode constitute a multiplexing unit. The data output pads are connected to corresponding output terminals of the multiplexers of the multiplexing unit and electrically connected to corresponding package pins in a packaging process.

When a swap among the data output pads based on the package pins is required to match the data output pads with the package pins, the individual swap correction units 100, 110, 120, 130 may apply multiplexing selection signals of byte units according to preset fuse program information to the corresponding multiplexers.

Output lines of SRR-related unique information are illustrated in the left side of FIG. 5. In FIG. 5, a ×32 configuration allowing a swap in bit units as well as in byte units is illustrated. In case of a $0^{th}$ byte CA1 and a $1^{st}$ byte CA2 of the SRR-related unique information, as the bit's significance increases, corresponding data output pad numbers decrease. In case of a $2^{nd}$ byte CA3 and a $3^{rd}$ byte CA4 of the SRR-related unique information, as the bit's significance increases, corresponding data output pad numbers decrease.

When a first multiplexing selection signal output from the first swap correction unit 100 in the 0$^{th}$ byte block 300 is '00', i.e., no swapping is needed, the 0$^{th}$ byte CA1 of the SRR-related unique information is selected. Referring to FIG. 5, the 4-to-1 multiplexer 200 receives 0 of CA1, 8 of CA2, 7 of CA3, and 15 of CA4 as inputs, and connects 0 of CA1 to the data output pad DQ0. The 4-to-1 multiplexer (not shown) corresponding to the data output pad DQ1 receives 1 of CA1, 9 of CA2, 6 of CA3, and 14 of CA4 as inputs, and connects 1 of CA1 to the data output pad DQ1. The 4-to-1 multiplexer 207 receives 7 of CA1, 15 of CA2, 0 of CA3, and 8 of CA4 as inputs, and connects 7 of CA1 to the data output pad DQ7. Similarly, other multiplexers of remaining data output pads may properly connect to appropriate inputs. Therefore, the first multiplexing selection signal in the 0$^{th}$ byte block 300 is '00'; a swap is not performed on the 0$^{th}$ byte block 300.

When a second multiplexing selection signal output from the second swap correction unit 110 of the 1$^{st}$ byte block 310 is '11', i.e., for both a byte swap and a bit swap, CA4 of the SRR-related unique information is selected. That is, a 4-to-1 multiplexer 208 receives 0 of CA1, 8 of CA2, 7 of CA3, and 15 of CA4 as inputs, and connects 15 of CA4 to the data output pad DQ8. The 4-to-1 multiplexer (not shown) corresponding to the data output pad DQ9 receives 1 of CA1, 9 of CA2, 6 of CA3, and 14 of CA4 as inputs, and connects 14 of CA4 to the data output pad DQ9. The 4-to-1 multiplexer 215 receives 7 of CA1, 15 of CA2, 0 of CA3, and 8 of CA4 as inputs, and connects 8 of CA4 to the data output pad DQ15. Similarly, other multiplexers of remaining data output pads may properly connect to appropriate inputs.

The configuration of FIG. 5 may be modified to perform a swap on data corresponding to some pads of the data output pads by an operation of multiplexers and to code data corresponding to the other pads to specific logic data. This may be for a data output swap on at least data output pads DQ8, DQ9, and DQ10.

As described above, it is possible to perform a byte swap and/or a bit swap in each byte on the basis of preset fuse program information.

According to a method of swapping data output pads of a semiconductor memory device having a SRR function for matching with pins of a package to which the semiconductor memory device is applied, the same number of multiplexers as part or all of the data output pads are prepared, and are controlled according to swap program information for creating a one-to-one correspondence between at least part of the pins of the package and at least part of the data output pads, thereby performing a byte swap and/or a bit swap in each byte.

Although the swap in case of ×32 according to an embodiment has been described with reference to FIG. 5, it can be appreciated that a fuse program can be made so that, even in case of ×16, a byte swap and/or a bit swap is possible.

Figure 6:
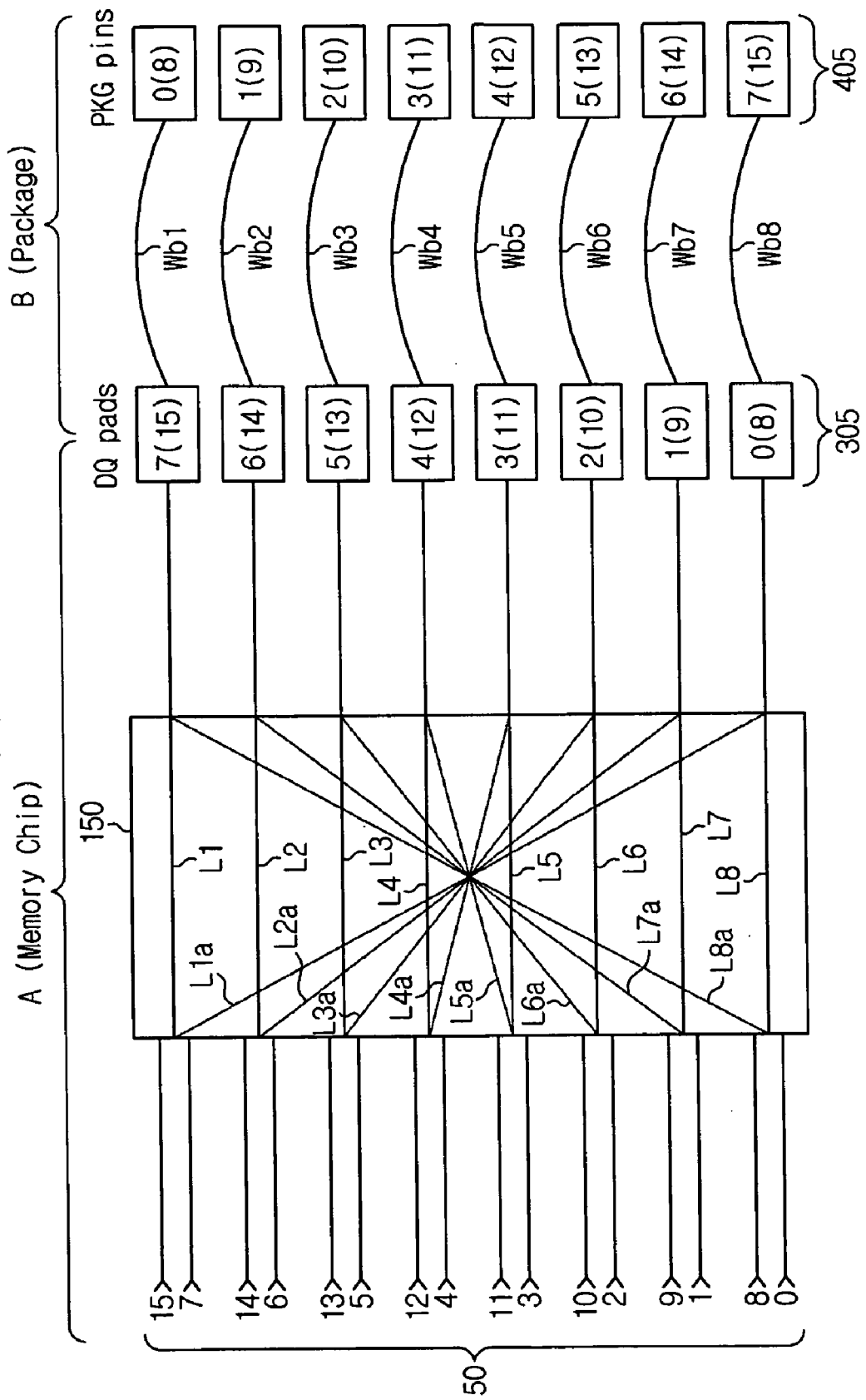
FIG. 6 illustrates a diagram of a swapping operation on data output pads with reference to FIG. 5.

FIG. 6 illustrates a swapping operation on data output pads with reference to FIG. 5. Referring to FIG. 6, for a case of ×16, a plurality of data output pads 305 are electrically connected in one-to-one with a plurality of package pins 405 by bonding wire lines wb1 to wb8 in a packaging process.

A swap controller 150 may be connected between a plurality of output lines 50 outputting the memory-related unique information in the specific operation mode and the plurality of data output pads. The swap controller controls a swap according to preset swap program information when a swap among the data output pads 305 is required to match the package pins 405. The swap controller 150 may include, for example, multiplexers 200 to 207 of the 0$^{th}$ byte block 300 of FIG. 5 and the swap correction unit 100.

When an arrangement of the data output pads 305 is different from an arrangement of the package pins 405 as shown in FIG. 6, a bit swap is required. In this case, the swap controller 150 controls a swap such that swapping paths L1a, L2a, L3a, L4a, L5a, L6a, L7a, and L8a are set. As a result, an output line 7 is connected to a data output pad DQ0 through the swapping path L1a and the data output pad DQ0 is connected to a package pin 7 by the bonding wire line wb8. Similarly, an output line 6 is connected to a data output pad DQ1 through the swapping path L2a and the data output pad DQ1 is connected to a package pin 6 by a bonding wire line wb7, and so froth. Finally, an output line 0 is connected to a data output pad DQ7 through the swapping path L8a and the data output pad DQ7 is connected to a package pin 0 by the bonding wire line wb1.

FIG. 1 illustrates an example of a data processing system capable of employing a memory device, e.g., a DRAM, according to embodiments.

A DRAM S10 according to embodiments may be used in a data processing system as shown in FIG. 1. The data processing system may include the DRAM S10, a micro processing unit (MPU) S2, a flash memory S4, a driver S6, and system buses B1, B2, and B5.

For example, the DRAM S10 may be connected to the MPU S2 by the system bus B1 and may function as a main memory element. The MPU S2 of the data processing system may be connected to the flash memory S4 by the system bus B5. The MPU S2 may perform a predetermined processing operation in accordance with a program stored in the flash memory S4 and may control the driver S6 through the system bus B2 periodically. While controlling the driver S6, the MPU S2 may perform a data access operation, e.g. a data write operation or a data read operation, on memory cells of the DRAM S10 in order to perform the processing operation.

When the MPU S2 performs data access on the DRAM S10, internal information of the DRAM S10 may need to be read. When the DRAM S10 enters the SRR mode in order to read the internal information, the internal information related to the DRAM S10 is output through pre-assigned data output pads.

Even when an arrangement of external pins of a package is different from an arrangement of data output pads of a DRAM chip, a correction on a swap among the data output pads may be performed as described above. Therefore, internal information related to DRAM is output normally through pre-assigned data output pads, which ensures a normal SRR operation mode.

In the SRR mode, coded internal temperature information may be output through swapped data output pads DQ8 to DQ10. The micro processing unit S2, having read the internal temperature information from the data output pads DQ8 to DQ10, can apply a command to change a refresh cycle to the DRAM S10 on the basis of the internal temperature information.

According to the embodiments of the invention, even when a DRAM chip having a plurality of data output pads for outputting memory-related unique information in a specific operation mode is mounted in any one of various types of packages, a swap operation is performed in accordance with swap program information, which makes an external controller capable of reliably reading the memory-related unique information.

While example embodiments have been particularly shown and described, it will be understood by one of ordinary skill in the art that variations in form and detail may be made therein without departing from the spirit and scope of the claims. For example, in some cases, the program scheme or multiplexing scheme may be modified without departing from the technical spirit and scope of the invention. When the fuse program scheme is not used, a metal option or mode register set signal may be used. Further, example embodiments of the present invention may be applied to other volatile memories, e.g., SRAM or Pseudo SRAM, or non-volatile memories, e.g., a flash memory, as well as to DRAM as discussed herein.

What is claimed is:

1. A semiconductor memory device, comprising:
a plurality of data output pads to be electrically connected to corresponding package pins in a packaging process; and
a swap controller connected between the plurality of data output pads and a plurality of output lines that output memory-related unique information in a specific operation mode, the swap controller configured to control a swap according to preset swap program information when a swap is needed to match the data output pads to the package pins,
wherein the swap controller includes:
a multiplexing unit having a plurality of multiplexers for every byte, each of the multiplexers connected to every predetermined number of the plurality of output lines, and
swap correction units configured to generate multiplexing selection signals according to the preset swap program information and to apply the multiplexing selection signals to the plurality of multiplexers to control the swap among the data output pads, the preset swap program information allowing a bit swap within one byte or a byte swap.

2. The device as claimed in claim 1, wherein the multiplexing selection signals are generated by a fuse program.

3. The device as claimed in claim 1, wherein the multiplexers are 4-to-1 multiplexers or 2-to-1 multiplexers.

4. The device as claimed in claim 1, wherein some of the data output pads are subjected to a swap according to the operation of the multiplexers and the others of the data output pads are coded with specific logic data.

5. The device as claimed in claim 1, wherein the preset swap program information is preset fuse program information.

6. The device as claimed in claim 1, wherein the plurality of output lines are configured to output memory-related unique information in the specific operation mode to the plurality of data output pads, each of the output lines being connected to one of the data output pads through the swap controller.

7. The device as claimed in claim 1, wherein the plurality of output lines include three or more output lines.

8. The device as claimed in claim 1, wherein the preset swap program information allows the bit swap within both the one byte and the byte swap.

9. The device as claimed in claim 8, wherein the swap controller includes each of the multiplexers connected between the predetermined number of the plurality of output lines and the plurality of data output pads.

10. A method of swapping data output pads of a semiconductor memory device having a status register read function to match package pins, the method comprising:
comparing an arrangement of the data output pads with an arrangement of package pins to be electrically connected to the data output pads in a packaging process; and
swapping the data output pads on the basis of the package pins to match the data output pins with the package pins in response to the comparison result.

11. The method as claimed in claim 10, wherein the comparison result allows for a bit swap within one byte and a byte swap swapping of the data output pads on the basis of the package pins.

12. The method as claimed in claim 10, wherein swapping the data output pads includes using preset swap program information as a basis for forming a connection between the data output pads and a corresponding one of a plurality of output lines that output memory-related unique information in a specific operation mode.

* * * * *